United States Patent [19]
Lee et al.

[11] Patent Number: 5,441,908
[45] Date of Patent: Aug. 15, 1995

[54] CAPACITOR OF A SEMICONDUCTOR DEVICE HAVING INCREASED EFFECTIVE AREA

[75] Inventors: Tae-woo Lee; Yang-goo Lee, both of Seoul; Byung-hak Lim, Anyang; Dong-gun Park, Suwon, all of Rep. of Korea

[73] Assignee: Samsung Electronics Co., Ltd., Suwon, Rep. of Korea

[21] Appl. No.: 992,659

[22] Filed: Dec. 18, 1992

[30] Foreign Application Priority Data

Dec. 18, 1991 [KR] Rep. of Korea ............... 91-23394

[51] Int. Cl.⁶ .................... H01L 21/70; H01L 27/00
[52] U.S. Cl. ............................ 437/52; 437/60; 437/919
[58] Field of Search ................... 437/52, 919, 60

[56] References Cited

U.S. PATENT DOCUMENTS

| | | | |
|---|---|---|---|
| 5,028,990 | 7/1991 | Kotaki et al. | 257/304 |
| 5,049,957 | 9/1991 | Inoue et al. | 437/52 |
| 5,068,698 | 11/1991 | Koyama | 437/52 |
| 5,234,857 | 8/1993 | Kim et al. | 437/60 |
| 5,321,649 | 6/1994 | Lee et al. | 437/52 |

OTHER PUBLICATIONS

3-Dimensional stacked capacitor cell for 16 M and 64 M DRAMS, Ema et al, 592-IEDM, 1988.

*Primary Examiner*—Olik Chaudhuri
*Assistant Examiner*—H. Jey Tsai
*Attorney, Agent, or Firm*—Charles R. Donohoe; Robert A. Westerlund, Jr.; Stephen R. Whitt

[57] ABSTRACT

A semiconductor memory device includes a plurality of memory cells each having a single transistor and a single capacitor on a semiconductor substrate. The capacitor has a storage electrode with an externally communicated box-type tunnel in its center, one portion of the storage electrode being connected to the source region of the transistor. A method for manufacturing the semiconductor memory device is also provided. Thus, storage capacity is raised by increasing the effective area of the capacitor, and the planarizing effect is also excellent.

3 Claims, 6 Drawing Sheets

CAPACITOR OF A SEMICONDUCTOR DEVICE HAVING INCREASED EFFECTIVE AREA

BACKGROUND OF THE INVENTION

The present invention relates to a semiconductor memory device and manufacturing method thereof, and more particularly to a semiconductor memory device and manufacturing method thereof capable of increasing cell capacitance by enlarging the effective area of a capacitor.

The development of large-scale memory devices is rapidly progressing, along with the development of semiconductor manufacturing techniques and expansion in the applied fields for a memory device. In particular, remarkable progress has been made in connection with a DRAM which achieves high packing density by forming an individual memory cell comprising a single capacitor and a single transistor. High-speed operation, high capacity and miniaturization of the DRAM can be realized by shrinking the individual unit area occupied by a memory cell, but this decreases cell capacitance and, in turn, lowers the memory cell's immunity to soft errors which impede reliable information storage.

Much research into increasing storable capacitance within an individual unit area has been reported, which plays an important role in reliable information storage, miniaturization, and expedient function of semiconductor devices.

Capacitor structures such as trench-type, stack-type, and combined stack/trench type are known to increase the storable capacitance in an individual unit cell. Particularly, the trench-type capacitor has characteristics superior to the stack-type with respect to greater capacitance, but has a higher soft error rate and higher leakage current, and it is more difficult to manufacture. The research on the stack-type capacitor has been actively pursued because it is easier to manufacture and has greater immunity to soft error in comparison to the trench-type capacitor.

FIGS. 1 through 4 are described in U.S. Pat. No. 4,974,040, entitled "Dynamic Random Access Memory Device and Manufacturing Method of Producing Same," which discusses a process for manufacturing a semiconductor memory device comprising a single-story stack-type capacitor.

As shown in FIG. 1, a field oxide layer 101 for separating an active region from an isolation region is formed in a semiconductor substrate 100. A gate electrode 5 is formed on semiconductor substrate 100. Source and drain region 7 and 8 are formed by doping an impurity in semiconductor substrate 100, using gate electrode 5 as a mask. Then, a first insulating layer 9 for insulating the gate electrode and etch-blocking is formed on the whole surface of a transistor consisting of the gate, drain, and source.

As shown in FIG. 2, first insulating layer 9 on semiconductor substrate 100 is etched by a photolithography process, thereby forming a contact hole 11.

As shown in FIG. 3, after forming a first conductive layer by depositing a conductive material on the whole surface of semiconductor substrate 100 having the transistor, a storage electrode pattern 15 is formed. Here, the conductive material, e.g., polycrystalline silicon doped with an impurity, is deposited to form the first conductive layer, and then storage electrode 15 is formed by applying a mask pattern to form the storage electrode pattern.

As shown in FIG. 4, a first dielectric film 16 and a plate electrode 17 are formed. Here, first dielectric film 16 is formed by thinly coating a dielectric material on the whole surface of storage electrode 15. Then, after forming a second conductive layer by depositing a conductive material, such as polycrystalline silicon doped with an impurity, on the whole surface of semiconductor substrate 100, plate electrode 17 is formed by applying a mask pattern.

The conventional semiconductor memory device having a stack-type capacitor manufactured according to the foregoing process has low parasitic transistor properties and strong immunity to soft error. However, since the capacitor area is confined to a small portion of an individual unit cell, it is difficult to increase the storage capacity. Also, when the surface area of the storage electrode is increased within the confined area in order to increase the storage capacity, the contact hole becomes deep in the region where the storage electrode is formed, which makes step-wise material coverage difficult and causes difficulty in metal processing due to the uneven topography of the capacitor.

SUMMARY OF THE INVENTION

It is an object of the present invention to provide a semiconductor memory device with increased storage capacity and excellent planarization properties, by enlarging the effective area of a capacitor.

It is an another object of the present invention to provide an effective method for manufacturing a semiconductor memory device with increased storage capacity and excellent planarization properties.

To achieve the above objects of the present invention, a semiconductor memory device is provided with a plurality of memory cells, each having a single transistor and a single capacitor on a semiconductor substrate, wherein the capacitor comprises a storage electrode having a box-type tunnel through its center in communication with the exterior, with one portion connected to the source region of the transistor.

To achieve another object of the present invention, a method for manufacturing a semiconductor memory device comprises the steps of:
  (a) forming a field oxide layer for defining an active region and an isolation region on the semiconductor substrate;
  (b) forming a transistor on the semiconductor substrate of the isolation region;
  (c) forming a first insulating layer for insulating the transistor;
  (d) etching the first insulating layer to form a contact hole for exposing the source region of the transistor; and
  (e) forming a storage electrode having a box-type tunnel through its center in communication with the exterior and with one portion connected to the source region by a contact hole.

BRIEF DESCRIPTION OF THE DRAWINGS

The above objects and other advantages of the present invention will become more apparent by describing in detail a preferred embodiment with reference to the attached drawings, in which.

DETAILED DESCRIPTION OF THE PREFERRED EMBODIMENTS

Figure 1:
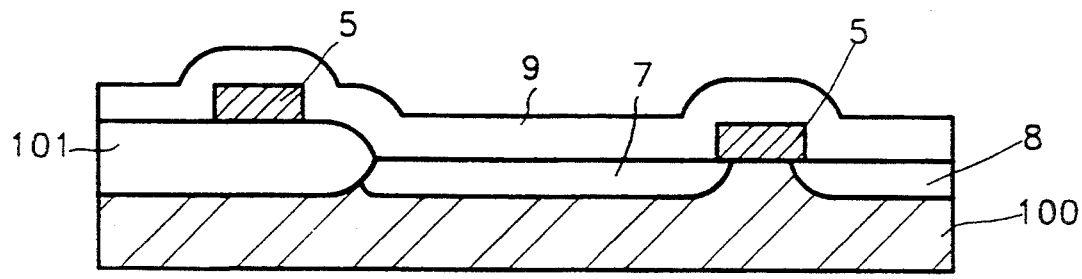
FIGS. 1 through 4 are sectional views showing a process for manufacturing a conventional semiconductor memory device.
Figure 2:
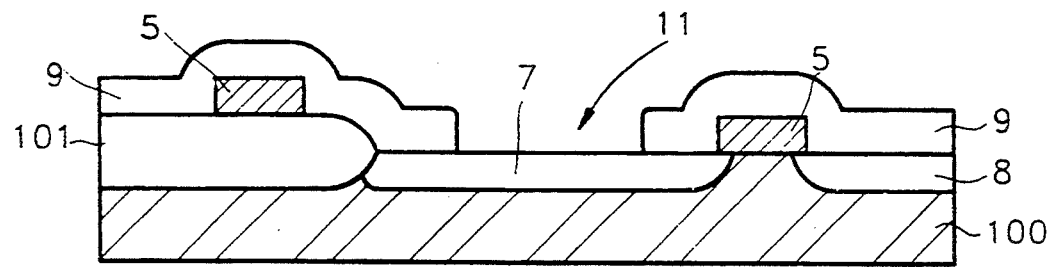
Figure 3:
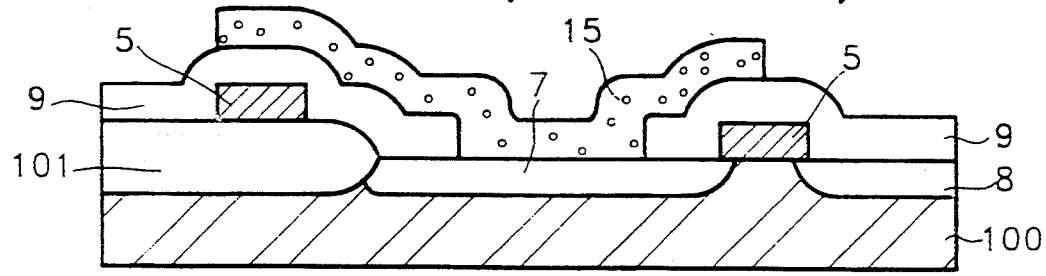
Figure 4:
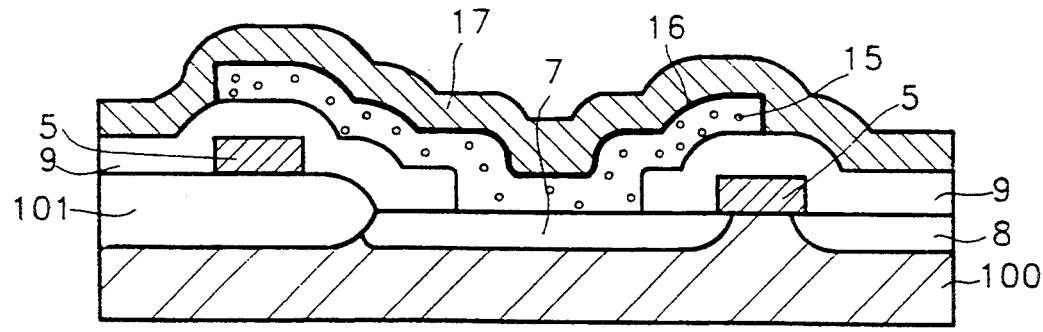
Figure 5:
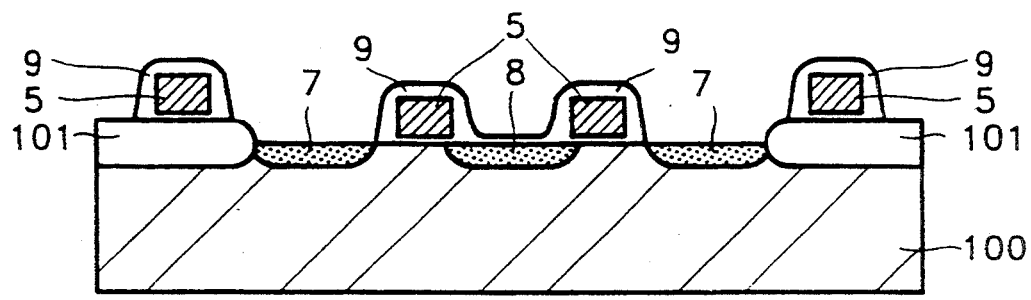
FIGS. 5 through 9 are sectional views showing an embodiment of a process for manufacturing a semiconductor memory device according to the present invention.

Referring to FIG. 5, a field oxide layer 101 for defining an active region and an isolation region is formed on a semiconductor substrate 100. After forming a gate electrode 5 on semiconductor substrate 100 of the active region, source region 7 and drain region 8 are formed by doping an impurity on semiconductor substrate 100, using gate electrode 5 as a mask.

Successively, a first insulating layer 9 is formed on the whole surface of the transistor, using an insulating material such as first high temperature oxide (HTO). The insulating layer 9 insulates the transistor, which consists of gate electrode 5, source region 7 and drain region 8. A contact hole is formed by etching first insulating layer 9 to expose source region 7 of the transistor.

Figure 6:
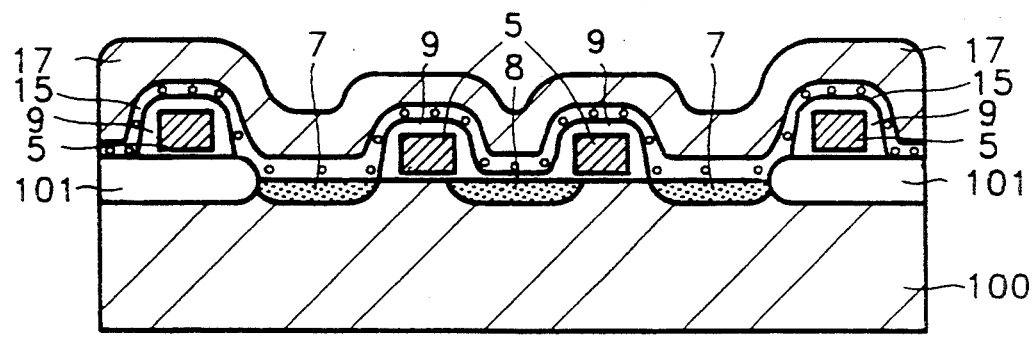

As shown in FIG. 6, after forming the contact hole, a material is coated on the whole surface of the resultant structure, thereby forming a first material layer 15. The material may be a first polycrystalline silicon (doped with an impurity), having a thickness of about 1,000Å. Then, a second insulating material, e.g., boro-phosphorous silicate glass (BPSG), is deposited on the first material layer 15 in a thickness of about 3,500Å, thereby forming a second insulating layer 17.

Figure 7:
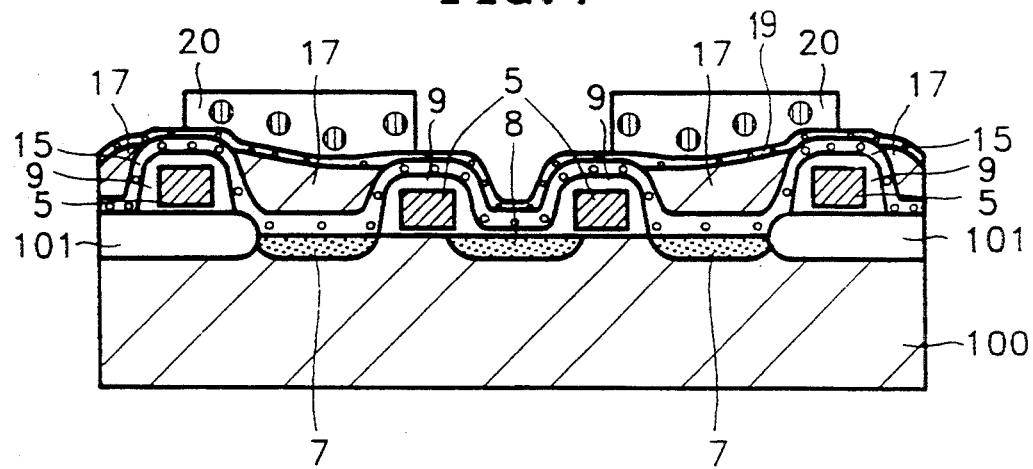

As shown in FIG. 7, a portion of the first material layer 15 is exposed by performing an etch-back operation upon the whole surface of the second insulating layer 17. Then a second material layer 19 is formed by coating the surface of the resultant structure with material. The material may be a second polycrystalline silicon (doped with an impurity) having a thickness of about 500Å. Here, first and second material layers 15 and 19 have the same etch rate. A photolithography mask pattern 20 is then formed on second material layer 19 of the source region.

Figure 8:
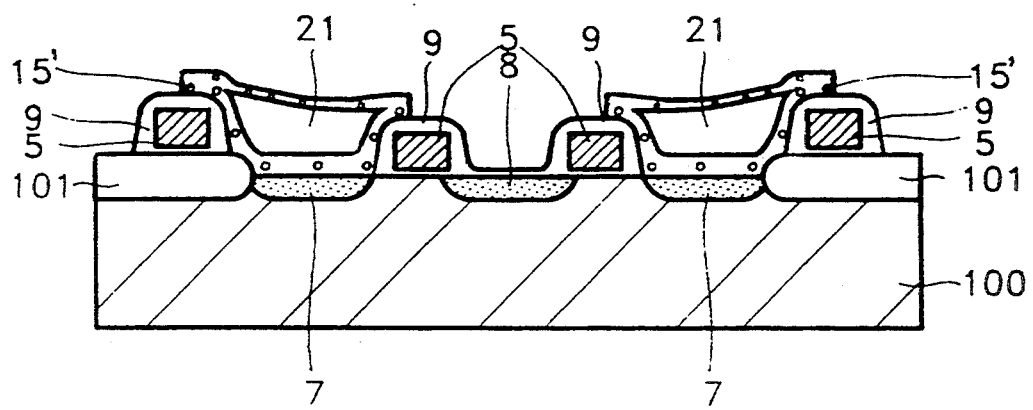

As shown in FIGS. 7 and 8, by applying a photolithography mask, first and second material layers 15 and 19 are etched where the photolithography mask does not cover them. The remaining first and second material layers under the photolithography mask together serve as a storage electrode 15'.

At this time, second material layer 19 is partially etched, thereby functioning as a buffer with respect to the structure below second material layer 19 on the photolithography mask pattern region during a wet etching step to follow.

Then, second insulating layer 17 is removed to form a tunnel 21 by wet etching using surfactant buffered oxide etchant (SBOE) solution, where the ratio of ammonium fluoride ($NH_4F$) to hydrogen fluoride (HF) is 7:1.

Thereafter, by applying the photolithography mask pattern, remaining part of the second material layer 19 is thoroughly etched, thereby completing a storage electrode 15' which has a box-type tunnel 21 therethrough in communication with the exterior. In a case where the storage electrode 15' is composed of the undoped polycrystalline silicon doped with impurity, they are doped with phosphorus oxychloride ($POCl_3$) after removing the photolithography mask pattern.

Figure 9:
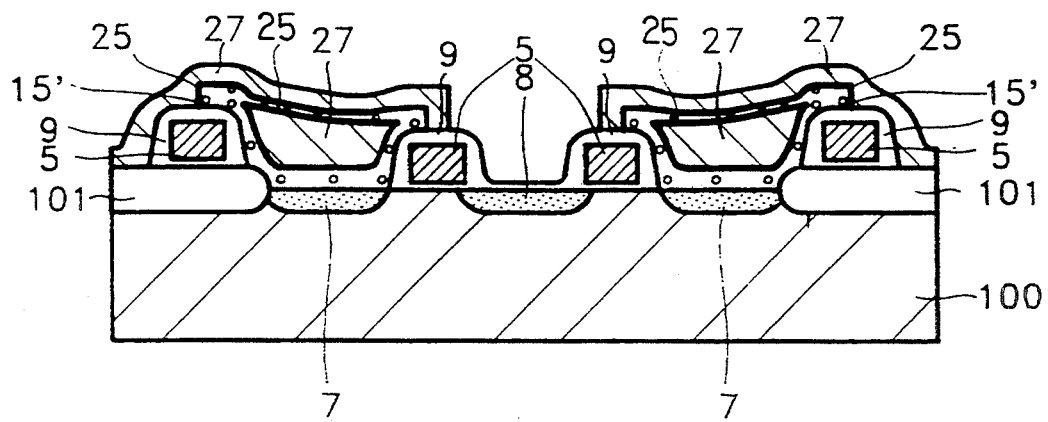

As shown in FIG. 9, a dielectric material is coated on the storage electrode 15' which has the box-type tunnel 27 through its center in communication with exterior and is composed of the first and second material layers, thereby forming a dielectric film 25. After forming dielectric film 25, a conductive material for forming a plate electrode, e.g., a third polycrystalline silicon doped with an impurity, is coated over the surface of the whole structure, thereby forming a first conductive layer 27. At the same time, the above-mentioned dielectric material is also coated on the inner surface of the box-type tunnel, and the conductive material for forming first conductive layer 27 fills central box-type tunnel 21.

FIGS. 10 through 14 illustrate another embodiment of a process for manufacturing a semiconductor memory device according to the present invention.

Figure 10:
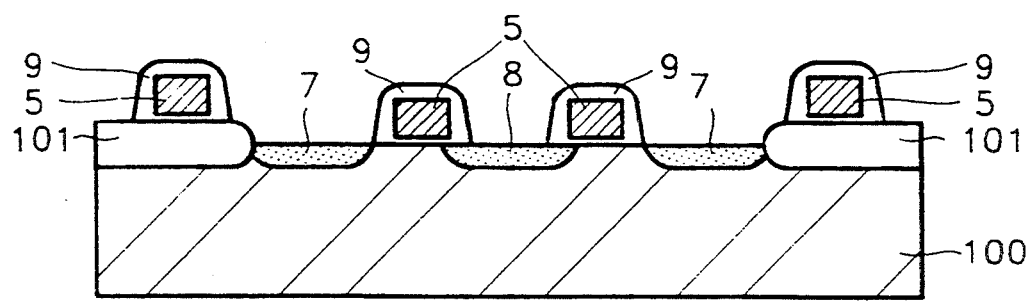
FIGS. 10 through 14 are sectional views showing another embodiment of a process for manufacturing a semiconductor memory device according to the present invention.

Referring to FIG. 10, a field oxide layer 101 for defining an active region and an isolation region is formed on a semiconductor substrate 100. A gate electrode 5 is formed on semiconductor substrate 100 of the active region. Then, source region 7 and drain region 8 are formed by doping an impurity in semiconductor substrate 100, using gate electrode 5 as a mask.

A first insulating layer 9 for insulating a transistor, consisting of gate electrode 5, source region 7 and drain region 8, is formed on the whole surface of the transistor, using an insulating material such as a first high temperature oxide (HTO). A contact hole is formed by etching first insulating layer 9 to expose source region 7 and drain region 8 of the transistor.

Figure 11:
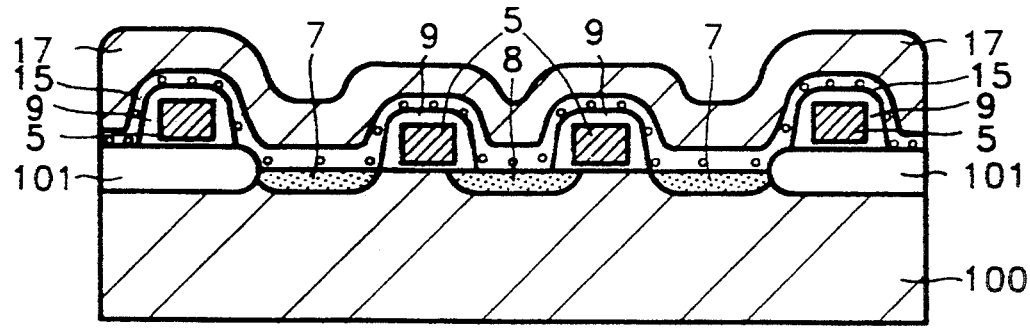

As shown in FIG. 11, after forming the contact hole, a material, e.g., a first polycrystalline silicon (which may be doped with an impurity), having a thickness of about 1,000 Å, is coated on the whole surface of the resultant structure, thereby forming a first material layer 15. Then, a second insulating material, e.g., BPSG, is deposited on material layer 15 in a thickness of about 3,500 Å, thereby forming a second insulating layer 17.

Figure 12:
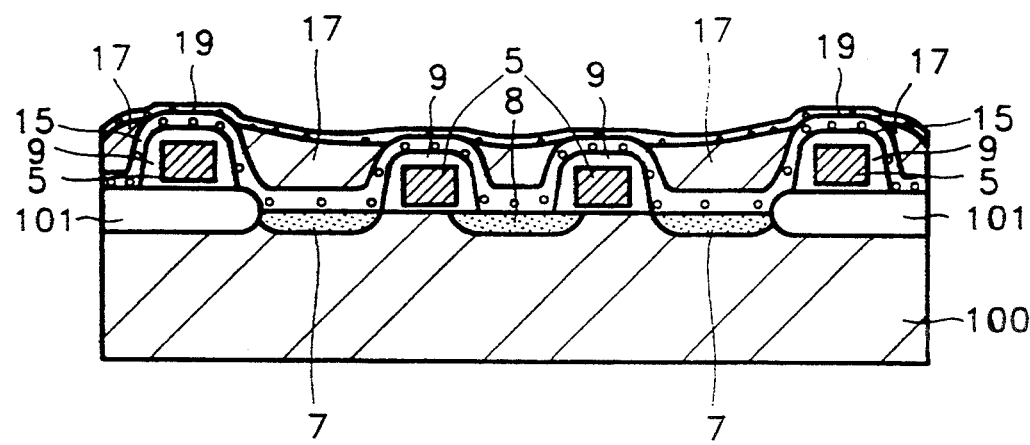

As shown in FIG. 12, a portion of first material layer 15 is exposed by performing etch-back upon the whole surface of second insulating layer 17. Then, a material, e.g., a second polycrystalline silicon (which may be doped with an impurity), having a thickness of about 500 Å, is coated on the whole surface of the resultant structure, thereby forming a second material layer 19.

Figure 13:
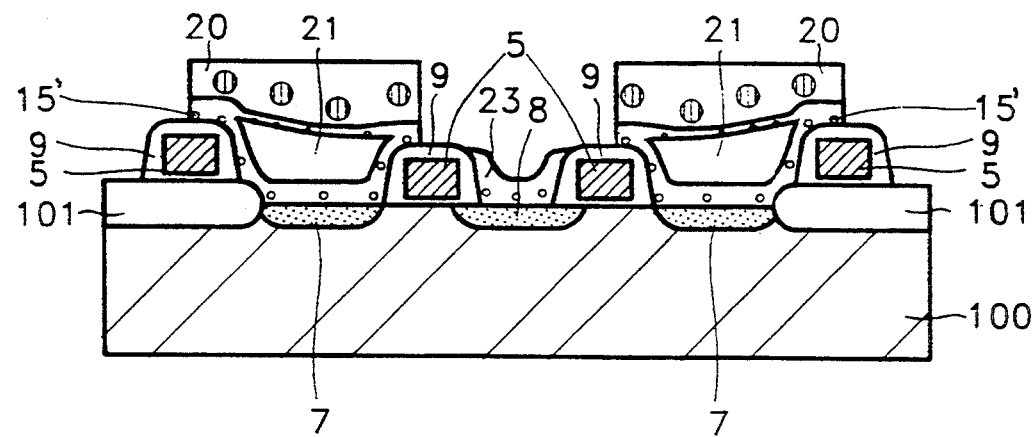

As shown in FIG. 13, a photolithography mask pattern 20 of a predetermined size is formed on second material layer 19, over source region 7. By applying the photolithography mask pattern 20, the first and second material layers 15 and 19 are simultaneously etched, thereby forming a storage electrode pattern. At this time, the first material layer on drain region 8 remains, since the second insulating layer 17 protects it from the etching.

Thereafter, the second insulating layer 17 is removed by means of an SBOE solution. Therefore, a storage electrode 15' which has a box-type tunnel 21 through its center in communication with the exterior is completed. Also, the unetched first material 15 remains on drain region 8 and forms a bit line 23.

Figure 14:
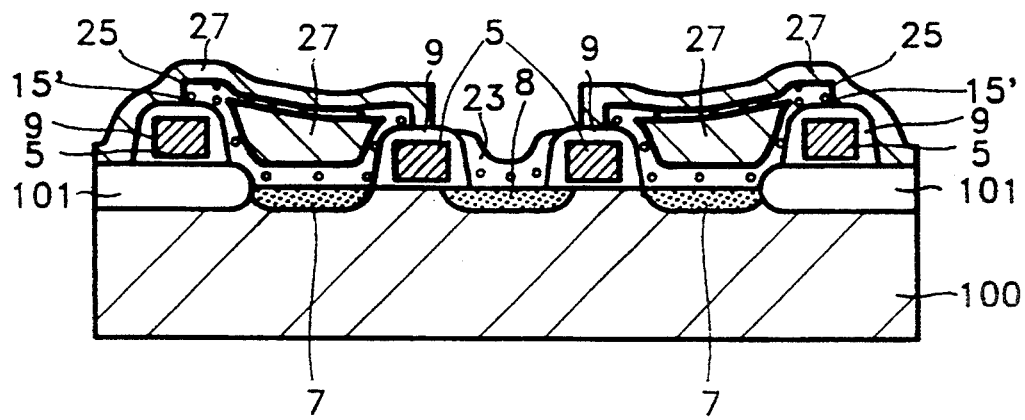

As shown in FIG. 14, after removing the photolithography mask pattern, the first and second material layers are simultaneously doped with phosphorus oxychloride (POCl$_3$), (if the first and second material layers are composed of an undoped polycrystalline silicon). A dielectric film 25 is coated on storage electrode 15' which has the box-type tunnel 21 and is composed of the first and second material layers. After forming dielectric film 25, a conductive material for forming a plate electrode, e.g., an impurity-doped third polycrystalline silicon, is coated on the whole surface of the resultant structure, thereby forming a first conductive layer 27. At the same time, the conductive material for forming first conductive layer 27 fills the central box-type tunnel 21.

FIGS. 15 through 19 illustrate still another embodiment of a process for manufacturing a semiconductor memory device according to the present invention.

Figure 15:
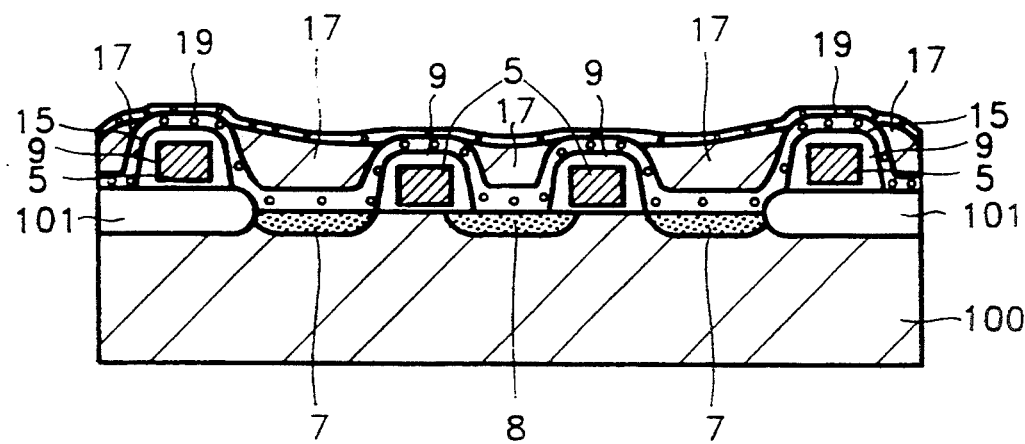
FIGS. 15 through 19 are sectional views showing still another embodiment of a process for manufacturing a semiconductor memory device according to the present invention.

The process shown in FIG. 15 is identical to those shown in FIGS. 10 through 12, except for allowing the etch rates of the first material 15 and second material 19 to be different from each other by:

varying the grain sizes of the first and second polycrystalline silicon, or adjusting the type or the doping density of the impurity in the first and second polycrystalline silicon.

Figure 16:
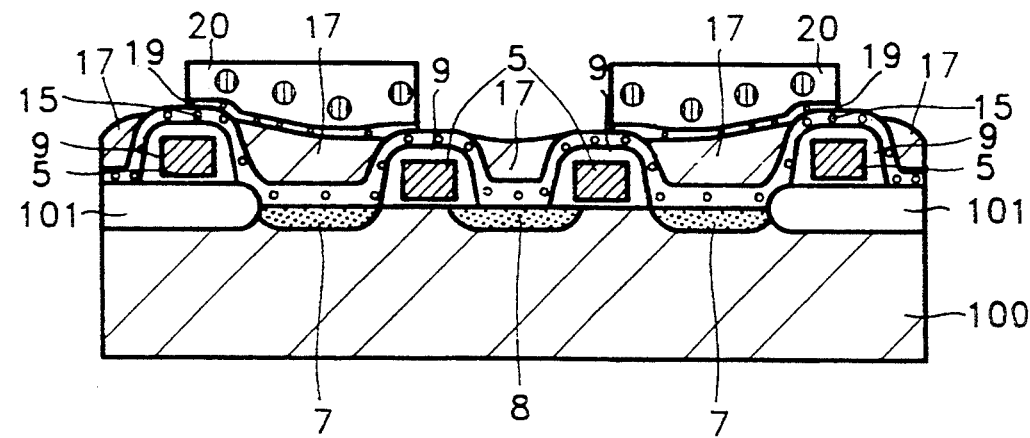

As seen from FIG. 16, a first photolithography mask pattern 20 of a predetermined size is formed on second material layer 19, over source region 7, through the processes of coating, mask-exposure and development of a photoresist.

Figure 17:
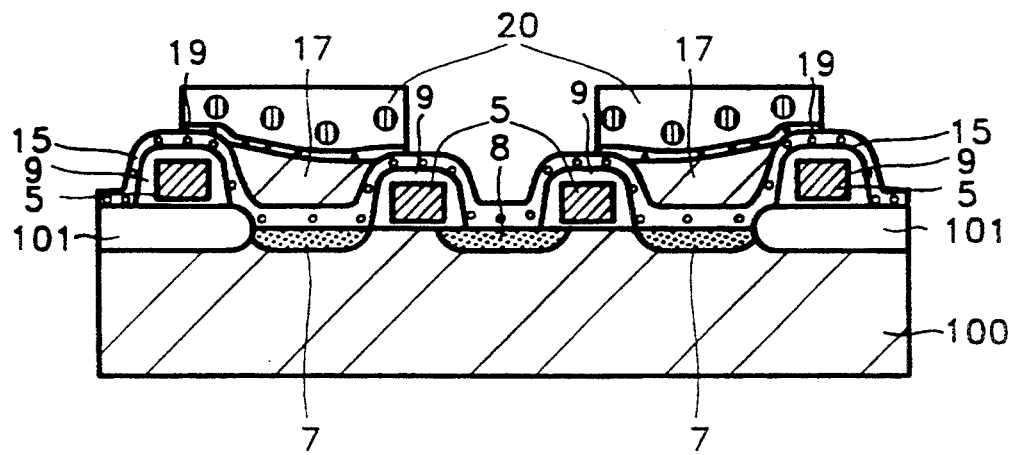

As seen from FIG. 17, by applying first photolithography mask pattern 20, second material layer 19 is etched, and then second insulating layer 7 is removed by SBOE solution. By doing so, first material layer 15 on drain region 8 is exposed.

Figure 18:
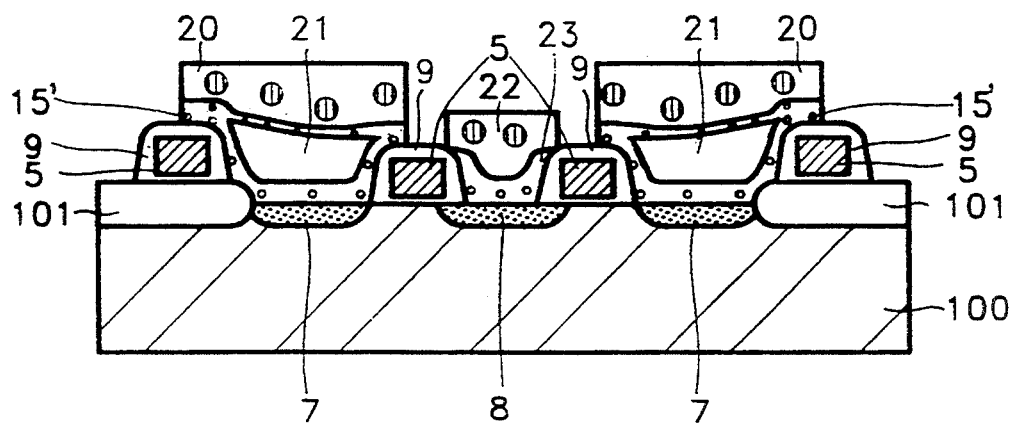

As seen from FIG. 18, a second photolithography mask pattern 22 for bit line formation is formed on the first material layer on drain region 8. After that, the second material layer 19 is etched by applying first and second photolithography mask pattern 20 and 22, to form a storage electrode 15' having a box-type tunnel 21 through its center in communication with the exterior, and a bit line 23, respectively.

Figure 19:
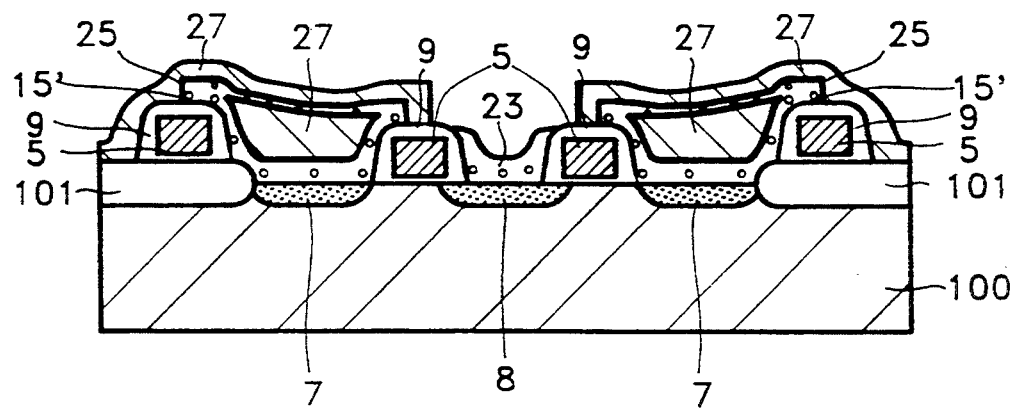

As seen from FIG. 19, when the first and second material layers are composed of the undoped polycrystalline silicon, the first and second material layers 15 and 19 are simultaneously doped with phosphorus oxychloride (POCl$_3$) after removing the first and second photolithography mask patterns.

A dielectric film 25 is coated on storage electrode 15', which has the box-type tunnel 21 formed between the first and second material layers 15 and 19.

After forming dielectric film 25, a conductive material for forming a plate electrode, e.g., an impurity-doped third polycrystalline silicon, is coated on the whole surface of the resultant structure, thereby forming a first conductive layer 27. At the same time, the conductive material for forming first conductive layer 27 fills central box-type tunnel 21.

The semiconductor memory device manufactured according to the present invention includes a storage electrode that is partly connected to the source region of a transistor and that has a box-type tunnel through its center in communication with the exterior. Therefore, as compared with the conventional stack-type capacitor, its effective area is increased roughly 30% to 40%, which results in raising the storage capacity by as much as 6fF to 8fF. Furthermore, since the contact hole in the region where the storage electrode is formed is not deepened (as with other methods for increasing the surface area of the storage electrode), problems caused due to step-wise material coverage can be resolved.

While the present invention has been particularly shown and described with reference to particular embodiments thereof, it will be understood by those skilled in the art that various changes in form and details may be effected without departing from the spirit and scope of the invention, as defined by the appended claims.

What is claimed is:

1. A method for manufacturing a semiconductor memory device including a plurality of memory cells, each said cell having a single transistor and a single capacitor on a semiconductor substrate, comprising the steps of:
   (a) forming a field oxide layer for defining an active region and an isolation region on said semiconductor substrate;
   (b) forming said transistor on said semiconductor substrate of said active region;
   (c) forming a first insulating layer for insulating said transistor;
   (d) etching said first insulating layer, thereby forming first and second contact holes for exposing source and drain regions of said transistor;
   (e) simultaneously forming a capacitor storage electrode having a tunnel which defines an interior surface therein which is open to an exterior of the storage electrode, and forming a bit line connected to said drain region via said second contact hole, said storage electrode being partially connected to said source region via said first contact hole;
   (f) forming a first dielectric layer portion and a second dielectric layer portion over said exterior and interior surfaces of said storage electrode, respectively; and
   (g) forming a plate electrode over said first and second dielectric layer portions.

2. A method for manufacturing a semiconductor memory device as claimed in claim 1, wherein said steps for simultaneously forming said storage electrode and said bit line further comprise the steps of:
   (a) forming a first material layer on the whole surface of the resultant structure, after forming said first and second contact holes;
   (b) forming a second insulating layer on said first material layer;
   (c) performing an etch-back operation upon the whole surface of said second insulating layer, thereby exposing a portion of said first material layer;
   (d) forming a second material layer on the whole surface of the resultant structure;
   (e) simultaneously etching said first and second material layers by applying a first mask pattern on said second material layer formed on said source region;
   (f) forming a storage electrode pattern of said capacitor and said bit line; and
   (g) removing the second insulating layer which remains after forming said storage electrode pattern and said bit line.

3. A method for manufacturing a semiconductor memory device as claimed in claim 1, wherein said steps for forming said storage electrode and bit line further comprise the steps of:

(a) forming a first material layer on the whole surface of the resultant structure, after forming said first and second contact holes;
(b) forming a second insulating layer on said first material layer;
(c) performing an etch-back operation upon the whole surface of said second insulating layer to thereby expose a portion of said first material layer;
(d) forming a second material layer on the whole surface of the resultant structure;
(e) forming a first mask pattern on said second material layer on said source region for forming said storage electrode of said capacitor;
(f) etching said second material layer by applying said first mask pattern;
(g) removing the portions of said second insulating layer exposed after etching said second material layer;
(h) forming a second mask pattern for forming said bit line on said first material layer on said drain region exposed by removing said insulating layer; and
(i) etching said first material layer by applying said first and second mask patterns.

* * * * *